(12) United States Patent
Arisawa et al.

(10) Patent No.: US 11,906,177 B2
(45) Date of Patent: Feb. 20, 2024

(54) OUTDOOR UNIT

(71) Applicant: Mitsubishi Electric Corporation, Tokyo (JP)

(72) Inventors: Koichi Arisawa, Tokyo (JP); Takuya Shimomugi, Tokyo (JP); Takashi Yamakawa, Tokyo (JP); Kenji Iwazaki, Tokyo (JP); Keisuke Mori, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 470 days.

(21) Appl. No.: 17/271,941

(22) PCT Filed: Oct. 11, 2018

(86) PCT No.: PCT/JP2018/037925
§ 371 (c)(1),
(2) Date: Feb. 26, 2021

(87) PCT Pub. No.: WO2020/075266
PCT Pub. Date: Apr. 16, 2020

(65) Prior Publication Data
US 2021/0318000 A1    Oct. 14, 2021

(51) Int. Cl.
*F24F 1/24*    (2011.01)
*H05K 1/02*    (2006.01)
*H05K 7/20*    (2006.01)

(52) U.S. Cl.
CPC .............. *F24F 1/24* (2013.01); *H05K 1/0203* (2013.01); *H05K 7/2039* (2013.01)

(58) Field of Classification Search
CPC ........ F24F 1/24; H05K 1/0203; H05K 7/2039; H05K 2201/066
See application file for complete search history.

(56) References Cited

FOREIGN PATENT DOCUMENTS

| EP | 1416230 B1 * | 4/2012 | ............... F24F 1/24 |
| JP | 2000-161717 A | 6/2000 | |

(Continued)

OTHER PUBLICATIONS

International Search Report of the International Searching Authority mailed Dec. 25, 2018 for the corresponding International application No. PCT/JP2018/037925 (and English translation).

*Primary Examiner* — Emmanuel E Duke
(74) *Attorney, Agent, or Firm* — POSZ LAW GROUP, PLC

(57) ABSTRACT

An outdoor unit includes: a housing; a compressor placed in the housing; a heat exchanger placed in the housing; and a blower placed in the housing, the blower admitting air from outside the housing and passing the air through the heat exchanger. Furthermore, the outdoor unit includes: a partition plate partitioning the housing into a compressor chamber and a blower chamber; a board on which an electronic component is mounted; a heat dissipator placed in the blower chamber and adjacent to the partition plate, the heat dissipator including a base and a plurality of fins, the base having a fin formation surface, the fins projecting from the fin formation surface, the heat dissipator dissipating heat of the electronic component; and a duct covering the heat dissipator. When the fins are viewed from the fin formation surface side, the fins extend toward the blower side from the partition plate side.

16 Claims, 4 Drawing Sheets

(56) References Cited

FOREIGN PATENT DOCUMENTS

| | | | |
|---|---|---|---|
| JP | 2007-093116 | A | 4/2007 |
| JP | 4900558 | B2 * | 3/2012 |
| JP | 2012-241918 | A | 12/2012 |
| JP | 2015-215149 | A | 12/2015 |
| JP | 2016114344 | A * | 6/2016 |

* cited by examiner

OUTDOOR UNIT

CROSS REFERENCE TO RELATED APPLICATION

This application is a U.S. national stage application of International Patent Application No. PCT/JP2018/037925 filed on Oct. 11, 2018, the disclosure of which is incorporated herein by reference.

TECHNICAL FIELD

The present invention relates to an outdoor unit of an air conditioner.

BACKGROUND

A blower that generates an airflow and a compressor that compresses a refrigerant are provided in a housing that forms the outer shell of an outdoor unit of an air conditioner. Furthermore, a partition plate is provided in the housing. The partition plate partitions the housing into a blower chamber in which a blower is placed and a compressor chamber in which a compressor is placed. Moreover, a board is provided in the housing. A semiconductor device, such as a wide-bandgap semiconductor or a reactor, for driving the compressor is mounted on the board. The semiconductor device is a heat-generating component that generates heat when a compressor is driven.

A heat dissipator that dissipates heat generated by the heat-generating component is provided on the board so as to prevent a heat generating portion from reaching an excessively high temperature. The heat dissipator includes a base and a plurality of fins. The base is in contact with the heat-generating component. The plurality of fins is formed on the base and spaced apart from each other. The heat generated by the heat-generating component is transferred to the heat dissipator. An airflow generated by the driving of the blower passes through spaces between the fins. As a result, the heat transferred to the heat dissipator is dissipated through the fins. The fins included in the heat dissipator extend parallel to the partition plate in consideration of the flow of air in the housing.

Patent Literature

Patent Literature 1: Japanese Patent Application Laid-open No. 2000-161717

According to the above-described conventional technique, a flow path formed between the fins tends to be longer. This is because the fins included in the heat dissipator extend parallel to the partition plate. As the flow path becomes longer, resistance increases in the entire flow path between the fins. Thus, there has been a problem that the flow velocity of air decreases while the air passes through the flow path, leading to a decrease in heat dissipation efficiency.

SUMMARY

The present invention has been made in view of the above, and an object of the present invention is to obtain an outdoor unit capable of improving the heat dissipation efficiency of heat generated by a heat-generating component provided in a housing.

In order to solve the above-described problem and achieve the object, an outdoor unit according to the present invention includes: a housing; a compressor placed in the housing; a heat exchanger placed in the housing; and a blower placed in the housing, the blower admitting air from outside the housing and passing the air through the heat exchanger. Furthermore, the outdoor unit includes: a partition plate partitioning the housing into a compressor chamber and a blower chamber, the compressor being placed in the compressor chamber, the blower being placed in the blower chamber; a board on which an electronic component is mounted, the electronic component driving the compressor; a heat dissipator placed in the blower chamber and adjacent to the partition plate, the heat dissipator including a base and a plurality of fins, the base having a fin formation surface, the fins projecting from the fin formation surface, the heat dissipator dissipating heat of the electronic component; and a duct covering a tip side of the fins in the heat dissipator to form a flow path, the air passing through the flow path. When the fins are viewed from the fin formation surface side, the fins extend toward the blower side from the partition plate side.

The outdoor unit according to the present invention has the effect of improving the heat dissipation efficiency of heat generated by the heat-generating component provided in the housing.

DESCRIPTION OF EMBODIMENTS

Hereinafter, an outdoor unit according to an embodiment of the present invention will be described in detail with reference to the drawings. Note that the present invention is not limited to the embodiment.

First Embodiment

Figure 1:
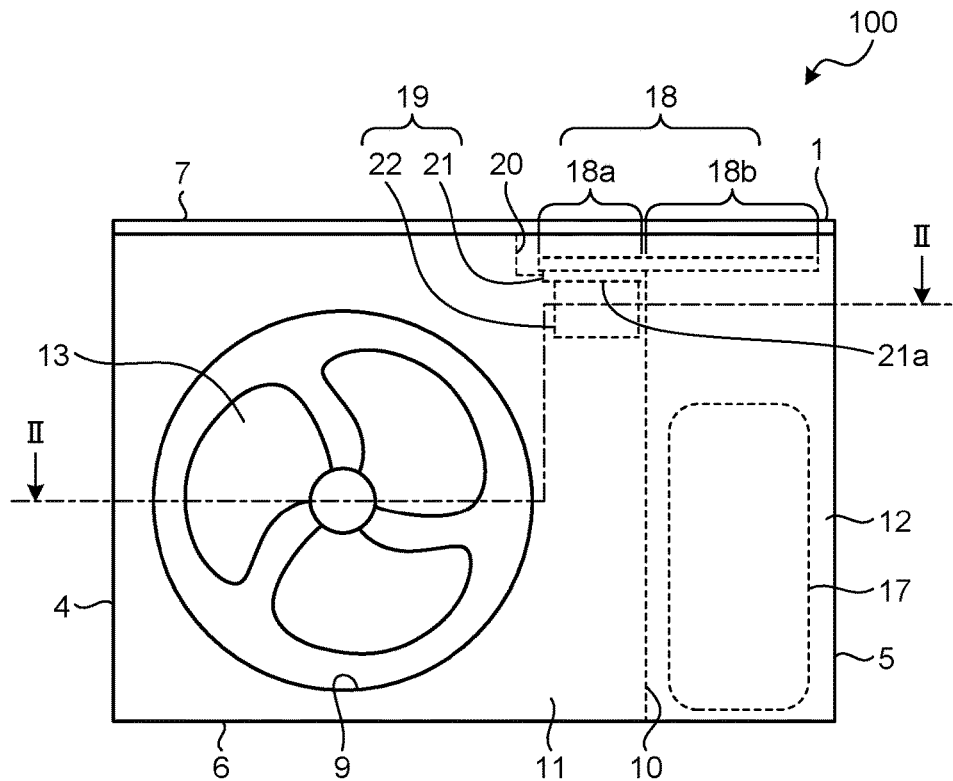
FIG. 1 is a front view of an outdoor unit according to a first embodiment of the present invention.
Figure 2:
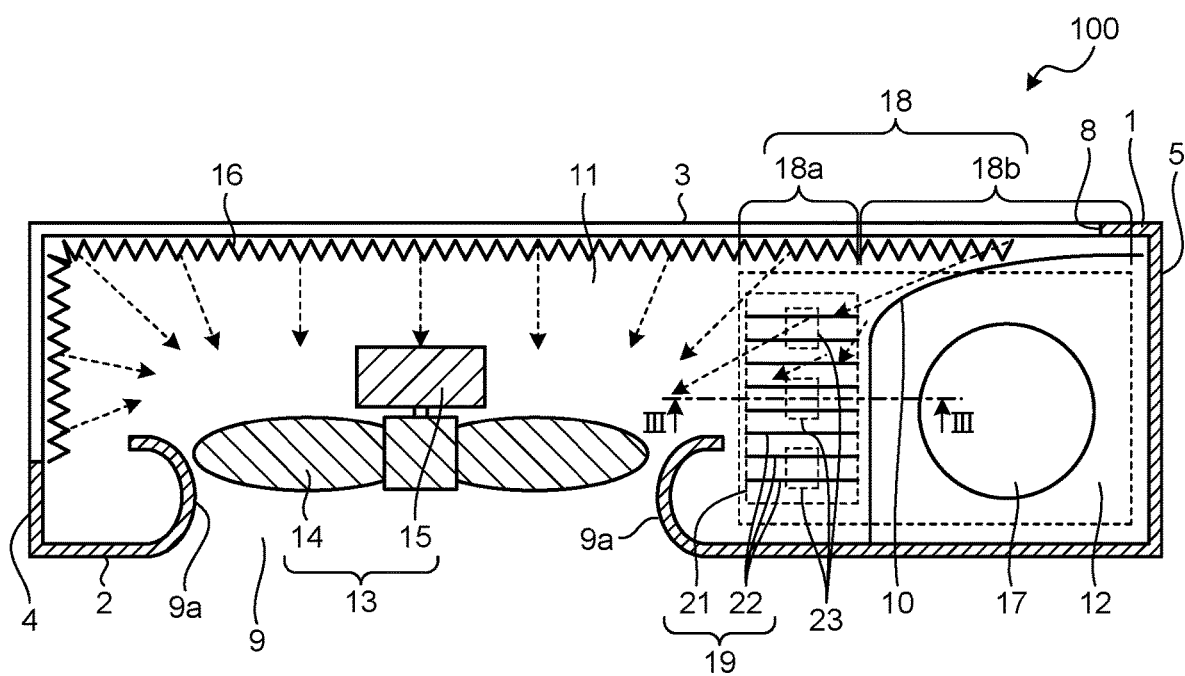
FIG. 2 is a sectional view taken along line II-II illustrated in FIG. 1.

FIG. 1 is a front view of an outdoor unit 100 according to a first embodiment of the present invention. FIG. 2 is a sectional view taken along line II-II illustrated in FIG. 1. The outdoor unit 100 is an outdoor unit of an air conditioner and is placed outdoors. The air conditioner performs air conditioning of a room by using a refrigerant that circulates between the outdoor unit 100 and an indoor unit placed indoors to cause heat transfer between indoor air and outdoor air.

The outdoor unit 100 includes a housing 1 that forms the outer shell of the outdoor unit 100. The housing 1 is a box body having a front surface 2, a back surface 3, side surfaces 4 and 5, a bottom surface 6, and a top surface 7 as wall surfaces. A suction port 8 corresponding to a first opening is formed in the back surface 3 and the side surface 4 of the housing 1. An outlet port 9 corresponding to a second opening is formed in the front surface of the housing 1. The outlet port 9 has a circular shape. A bell mouth 9a projecting toward the inside of the housing 1 is formed at the opening edge of the outlet port 9.

Note that in the following description, a direction that the front surface 2 faces may be referred to as the front, and a direction opposite to the front may be referred to as the rear. In addition, the front and rear directions may be collectively referred to as a front-rear direction. The front-rear direction is a direction perpendicular to a vertical direction, that is, the direction of gravity. Furthermore, the left side of the outdoor unit 100 viewed from the front may be referred to as the left, and the right side of the outdoor unit 100 viewed from the front may be referred to as the right. In addition, the left and right directions may be collectively referred to as a left-right direction. The left-right direction is a direction perpendicular to the vertical direction and the front-rear direction. Furthermore, the upper side of the outdoor unit 100 viewed from the front may be referred to as an upward direction and the lower side of the outdoor unit 100 viewed from the front may be referred to as a downward direction. In addition, the upward direction and the downward direction may be collectively referred to as an upward-downward direction. The upward-downward direction is parallel to the vertical direction. The side surface 4 is a left side surface which is one of the side surfaces of the outdoor unit 100 viewed from the front. The side surface 5 is a right side surface which is the other side surface of the outdoor unit 100 viewed from the front.

A partition plate 10 is provided in the housing 1. The partition plate 10 partitions a space inside the housing 1 into a blower chamber 11 corresponding to a space on the left side and a compressor chamber 12 corresponding to a space on the right side. The suction port 8 and the outlet port 9 described above are formed in a wall surface surrounding the blower chamber 11. Note that the space on the right side may serve as the blower chamber 11, and the space on the left side may serve as the compressor chamber 12. Furthermore, as illustrated in FIG. 2, the partition plate 10 extends from the front surface 2 to the back surface 3 when viewed from above, but is bent toward the side surface 5 side before reaching the back surface 3. As a result, most of the region close to the back surface 3 in the internal space of the housing 1 is included in the blower chamber 11. Thus, the suction port 8 can be formed in the entire back surface 3.

A blower 13 is placed in the blower chamber 11. The blower 13 is located behind the outlet port 9. The blower 13 includes an impeller 14 and a fan motor 15 that is a power source for the impeller 14. As the fan motor 15 is driven, the blower 13 rotates the impeller 14 to cause air around the blower 13 to flow. The air caused to flow by the blower 13 is taken into the housing 1 from outside the housing 1 through the suction port 8, and discharged to the outside of the housing 1 through the outlet port 9. In each drawing, the flow of air caused by the blower 13 is indicated by a dashed arrow. Furthermore, in the following description, the driving of the fan motor 15 is also referred to as the driving of the blower 13.

A heat exchanger 16 is provided in the blower chamber 11. The heat exchanger 16 is provided along the back surface 3 and the side surface 4 of the housing 1 to cover the suction port 8. A flow path (not illustrated) is provided in the heat exchanger 16 such that the refrigerant can pass through the flow path. Furthermore, the air taken into the housing 1 through the suction port 8 by the driving of the blower 13 passes through the heat exchanger 16.

A compressor 17 is placed in the compressor chamber 12. The compressor 17 compresses the refrigerant. The refrigerant compressed by the compressor 17 is sent to the flow path of the heat exchanger 16. The heat exchanger 16 causes heat exchange between the refrigerant passing through the flow path and the air taken into the housing 1.

The outdoor unit 100 includes a board 18 and a heat dissipator 19. Electronic components 23 that are heat-generating components are mounted on the board 18. The heat dissipator 19 dissipates heat generated by the electronic components 23. The board 18 and the electronic components 23 are housed in an electrical component box 20. The electrical component box 20 is provided above the compressor 17. Furthermore, a part of the electrical component box 20 is exposed to the blower chamber 11, and another part of the electrical component box 20 is exposed to the compressor chamber 12. More specifically, the partition plate 10 partitioning the inside of the housing 1 extends upward from the bottom surface 6. However, a part of the partition plate 10 does not reach the top surface 7, so that a gap is formed between the top surface 7 and the partition plate 10. The electrical component box 20 is provided in this gap. The board 18 housed in the electrical component box 20 has a first portion 18a and a second portion 18b. The first portion 18a is housed in the part of the electrical component box 20 exposed to the blower chamber 11. The second portion 18b is housed in the another part of the electrical component box 20 exposed to the compressor chamber 12. Note that the first portion 18a can also be represented as a portion of the board 18 located to the left of the partition plate 10, and the second portion 18b can also be represented as a portion of the board 18 located to the right of the partition plate 10.

The heat dissipator 19 is a heat sink including a plurality of fins 22. The heat dissipator 19 is provided on a lower surface, that is, a first surface of the first portion 18a of the board 18. In other words, the heat dissipator 19 is provided on the lower surface of the portion of the board 18 located to the left of the partition plate 10. Furthermore, the heat dissipator 19 is provided at a position between the blower 13 and the compressor 17 when viewed from above. Note that, among the constituent elements provided in the housing 1, the compressor 17, the partition plate 10, the board 18, the heat dissipator 19, and the electrical component box 20 are represented by broken lines in FIG. 1. In addition, a base 21 and the electronic components 23 are represented by broken lines in FIG. 2.

The heat dissipator 19 includes the base 21 and the plurality of fins 22. The base 21 has a rectangular parallelepiped shape, and a surface thereof facing upward is in contact with the electronic components 23 mounted on the board 18. A surface of the base 21, facing downward is a fin formation surface 21a on which the plurality of fins 22 is provided. The fin formation surface 21a has a rectangular shape, and is provided such that the front-rear direction corresponds to its longitudinal direction and the left-right direction corresponds to its transverse direction.

The plurality of fins 22 is formed such that the fins 22 project from the fin formation surface 21a and are spaced apart from each other. The plurality of fins 22 projects to the outside of the electrical component box 20 to be exposed to the blower chamber 11. Each of the plurality of fins 22 is formed in such a way as to extend from the partition plate 10 side toward the blower 13 side when viewed from the fin formation surface 21a side, that is, when viewed from below. As a result, when viewed from below, the length of each of the plurality of fins 22 is equal to or greater than the length of the fin formation surface 21a along the transverse direction, and less than the length of the fin formation surface 21a along the longitudinal direction. In the example illustrated in FIG. 2, each of the plurality of fins 22 is formed parallel to the front surface 2 of the housing 1.

A plurality of the electronic components 23 mounted on the board 18 includes an electronic component 23 that drives the compressor 17 and an electronic component 23 that drives the blower 13. The electronic component 23 is exemplified by a semiconductor device or a reactor. Examples of the semiconductor device include wide-bandgap semiconductors using silicon carbide, gallium nitride, gallium oxide, and diamond. The plurality of electronic components 23 is mounted on a lower surface, that is, the first surface of the first portion 18a of the board 18. As a result, the electronic components 23 and the heat dissipator 19 face each other on the first portion 18a of the board 18. As illustrated in FIG. 2, the plurality of electronic components 23 is arranged side by side in the front-rear direction. Heat generated by the electronic component 23 when at least either the compressor 17 or the blower 13 is driven is transferred to the heat dissipator 19 to be dissipated. More specifically, the heat generated by the electronic component 23 is transferred to the fins 22 through the base 21. The driving of the blower 13 causes air to flow in the housing 1, and the air passes over the surfaces of the fins 22. As a result, heat is transferred from the fins 22 to the air to be dissipated.

Figure 3:
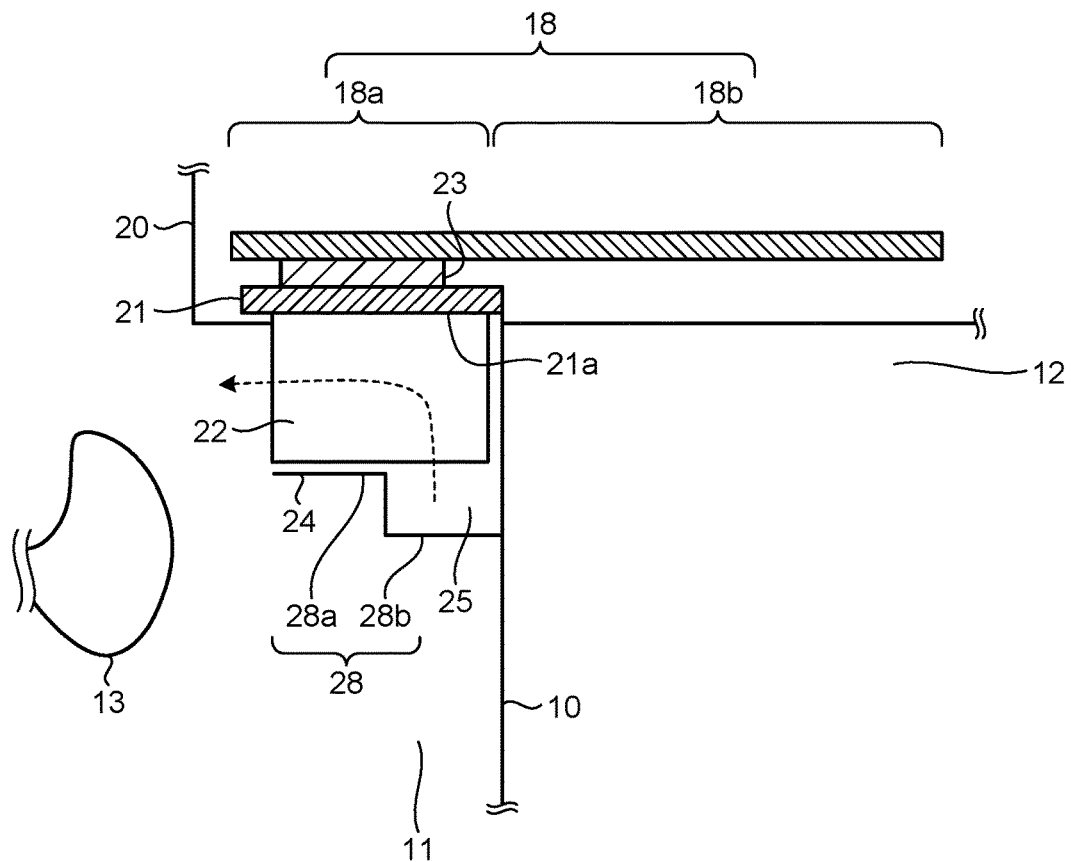
FIG. 3 is a sectional view taken along line III-III illustrated in FIG. 2.
Figure 4:
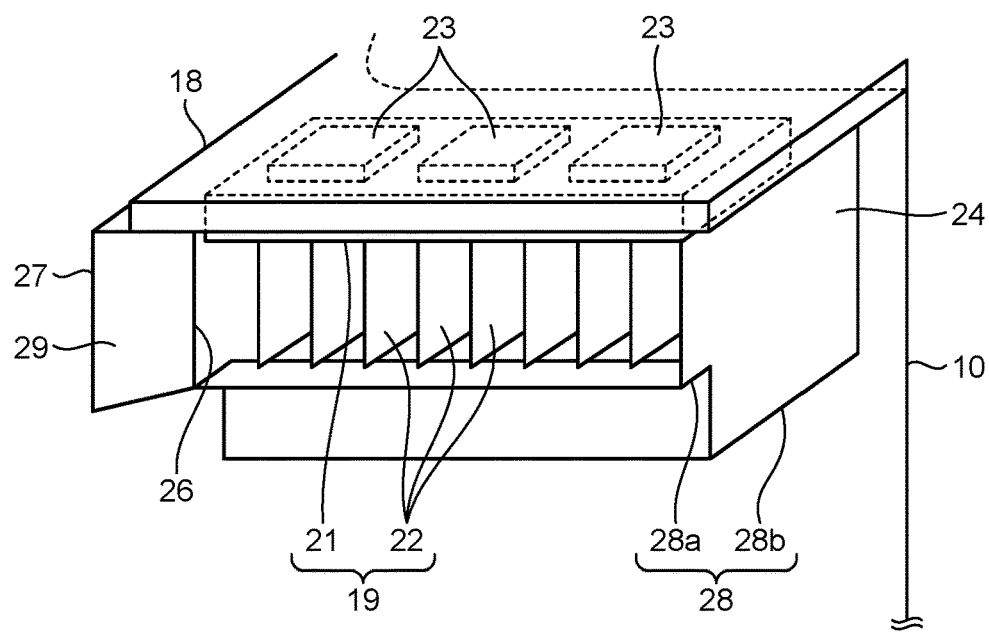
FIG. 4 is an enlarged schematic perspective view of a heat dissipator in the first embodiment.
Figure 5:
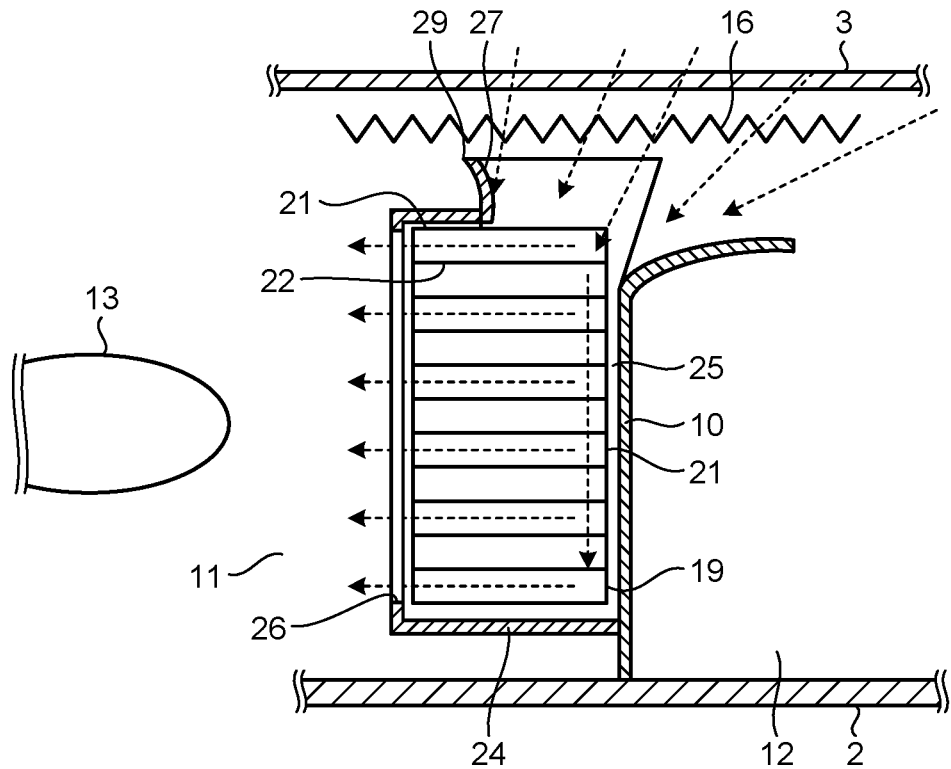
FIG. 5 is an enlarged schematic plan view of the heat dissipator in the first embodiment.

FIG. 3 is a sectional view taken along line III-III illustrated in FIG. 2, which is an enlarged view of the heat dissipator 19. FIG. 4 is an enlarged schematic perspective view of the heat dissipator 19 in the first embodiment. FIG. 5 is an enlarged schematic plan view of the heat dissipator 19 in the first embodiment. The outdoor unit 100 includes a duct 24 that surrounds the heat dissipator 19. The inside of the duct 24 is a flow path 25 through which air passes.

An outlet 26 that allows air to flow out from the flow path 25 is formed on the blower 13 side of the duct 24. An inlet 27 that allows air to flow into the flow path 25 is formed on the back surface 3 side of the duct 24. Note that in the present embodiment, that is, the first embodiment, the duct 24 is fully opened on the partition plate 10 side, and the edge of the opening is in contact with the partition plate 10. Therefore, a part of the opening of the duct 24, formed on the partition plate 10 side and not covered with the partition plate 10, that is, a part of the opening close to the back surface 3 serves as a part of the inlet 27.

The duct 24 has a facing surface 28 that faces the fin formation surface 21a of the heat dissipator 19. The facing surface 28 is provided with a step, so that a region 28b on the partition plate 10 side is located farther from the fin formation surface 21a than a region 28a on the blower 13 side. As a result, a space is formed between the fins 22 and the region 28b such that air flowing in from the inlet 27 can pass through the space without being blocked by the fins 22.

As illustrated in FIG. 5, a part of the duct 24, located on the back surface 3 side is a guide portion 29 where the flow path expands toward the back surface 3. The guide portion 29 may be formed by a curved surface as illustrated in FIG. 5, or may be formed by a flat surface.

Figure 6:
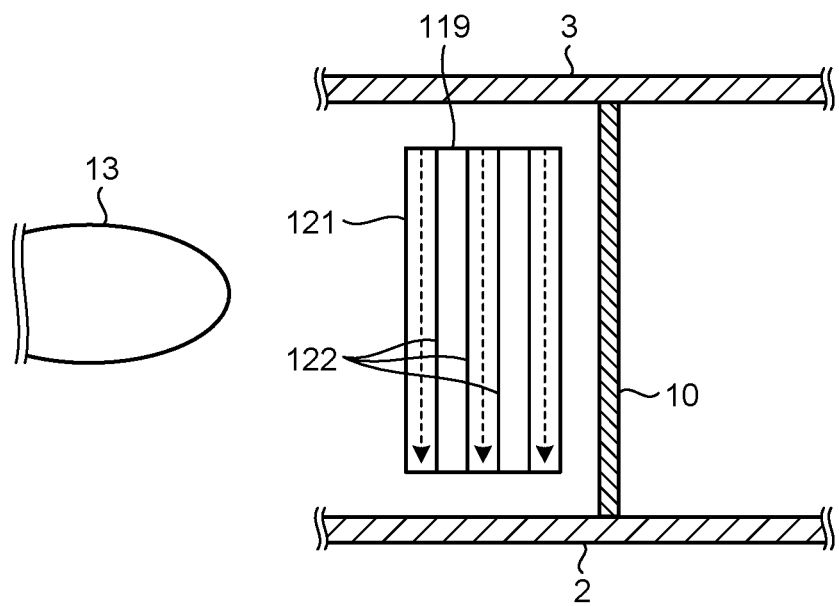
FIG. 6 is an enlarged schematic plan view of a heat dissipator of an outdoor unit according to a comparative example.

FIG. 6 is an enlarged schematic plan view of a heat dissipator 119 of an outdoor unit according to a comparative example. In the comparative example, a base 121 included in the heat dissipator 119 is formed in a rectangular shape such that the front-rear direction corresponds to its longitudinal direction when viewed from above, as in the first embodiment. Furthermore, unlike the first embodiment, each of a plurality of fins 122 extends in a direction parallel to the front-rear direction, that is, a direction parallel to the partition plate 10 when viewed from above in the comparative example. Therefore, the length of each of the plurality of fins 122 viewed from above is equal to the length of the base along the longitudinal direction. Thus, the plurality of fins 122 is larger in length than the plurality of fins 22 according to the present embodiment, that is, the first embodiment.

Here, air caused to flow by the driving of the blower 13 passes through spaces between the plurality of fins 122. That is, the spaces between the plurality of fins 122 serve as flow paths through which air passes. The same applies to the fins 22 in the present embodiment, that is, the first embodiment. Therefore, the flow paths formed between the plurality of fins 122 are longer than flow paths formed between the plurality of fins 22.

The air caused to flow by the driving of the blower 13 passes through the spaces between the plurality of fins 122 from the back surface 3 side to the front surface 2 side. Since the flow paths formed between the plurality of fins 122 are long, resistance increases in the entire flow paths, and the flow velocity of air passing through the flow paths decreases before the air flowing from the back surface 3 side to the spaces between the plurality of fins 122 reaches the front surface 2 side. As a result, heat dissipation efficiency decreases As illustrated in FIG. 5, air passes from the partition plate 10 side toward the blower 13 side in the flow paths formed between the plurality of fins 22. In the present embodiment, that is, the first embodiment, the flow paths formed between the plurality of fins 22 are shorter than those in the comparative example. Therefore, air passing through the flow paths formed between the plurality of fins 22 can reach the blower 13 side before the velocity of air decreases, so that it is possible to prevent a decrease in the velocity of air in the flow paths and a decrease in heat dissipation efficiency.

Furthermore, in the present embodiment, that is, the first embodiment, the duct 24 surrounding the heat dissipator 19 is provided to guide and allow air to smoothly pass through the flow paths between the plurality of fins 22. Compared to the outlet port 9 formed in the front surface 2, the suction port 8 formed in the back surface 3 extends to the right. Therefore, as illustrated in FIG. 2, when the blower 13 is driven, air tends to move diagonally from the right rear side toward the outlet port 9 in a region where the heat dissipator 19 is provided.

As illustrated in FIG. 5, the duct 24 takes the air moving diagonally into the flow path 25 from the inlet 27. The air taken into the flow path 25 passes through a space not blocked by the fins 22, that is, a space between the region 28b of the facing surface 28, located on the partition plate 10 side, and the fins 22 toward the front surface 2. As illustrated in FIG. 3, the air having passed through the space between the region 28b and the fins 22 enters the flow paths formed between the plurality of fins 22 from below the fins 22.

The air having entered the flow paths formed between the plurality of fins 22 moves toward the blower 13 side, and flows out from the outlet 26 formed in the duct 24. In this way, it is possible to allow air to smoothly pass through the flow paths formed between the fins 22 by guiding air moving diagonally around the heat dissipator 19 toward the flow paths formed between the fins 22 by means of the duct 24. As a result, the flow rate of air passing through the flow paths formed between the fins 22 can be increased to improve heat dissipation efficiency.

Furthermore, the plurality of electronic components 23 is arranged side by side in the front-rear direction. Meanwhile, when the fins 122 extend in the front-rear direction as shown in the comparative example, there will be an electronic component 23 located above the upstream part of the flow paths formed between the plurality of fins 122 and an electronic component 23 located above the downstream part of the same flow paths. In this case, air increased in temperature by heat transfer from the fins 122 in the upstream part of the flow paths flows toward the downstream part. Therefore, heat from the electronic component 23 located above the downstream part may not be sufficiently dissipated.

Meanwhile, in the present embodiment, that is, the first embodiment, the fins 22 extend in the left-right direction, so that a case is unlikely to occur in which any of the electronic components 23 is located in the upstream part and another of the electronic components 23 is located in the downstream part of the same flow paths formed between the plurality of fins 22. Therefore, it is possible to uniformly perform heat dissipation for the electronic components 23 arranged side by side along the front-rear direction. As a result, it is possible to prevent insufficient dissipation of heat from some of the electronic components 23.

A space through which air can pass is formed between the region 28b of the facing surface 28 and the fins 22, so that air can enter the flow paths formed between the fins 22 from the space. Thus, it is not necessary to provide a gap between the heat dissipator 19 and the partition plate 10. Therefore, the heat dissipator 19 and the partition plate 10 can be located close to each other to reduce the width of the outdoor unit 100 in the left-right direction. For example, the distance between the heat dissipator 19 and the partition plate 10 may be less than the heights of the fins 22 in the upward-downward direction. Note that the distance between the heat dissipator 19 and the partition plate 10 may be increased to provide a space through which air can easily pass, without consideration for the width of the outdoor unit 100 in the left-right direction.

The guide portion 29 formed at the inlet 27 of the duct 24 enables air to be smoothly taken into the duct 24. Note that the inlet 27 may be formed only on the back surface 3 side of the duct 24, or may be formed only on the side surface 5 side.

In the example cited in the present embodiment, that is, the first embodiment, the electronic components 23, the heat dissipator 19, and the duct 24 are provided on the lower surface of the board 18, but may be provided on the opposite surface. That is, the electronic components 23, the heat dissipator 19, and the duct 24 may be provided on the upper surface of the board 18.

Figure 7:
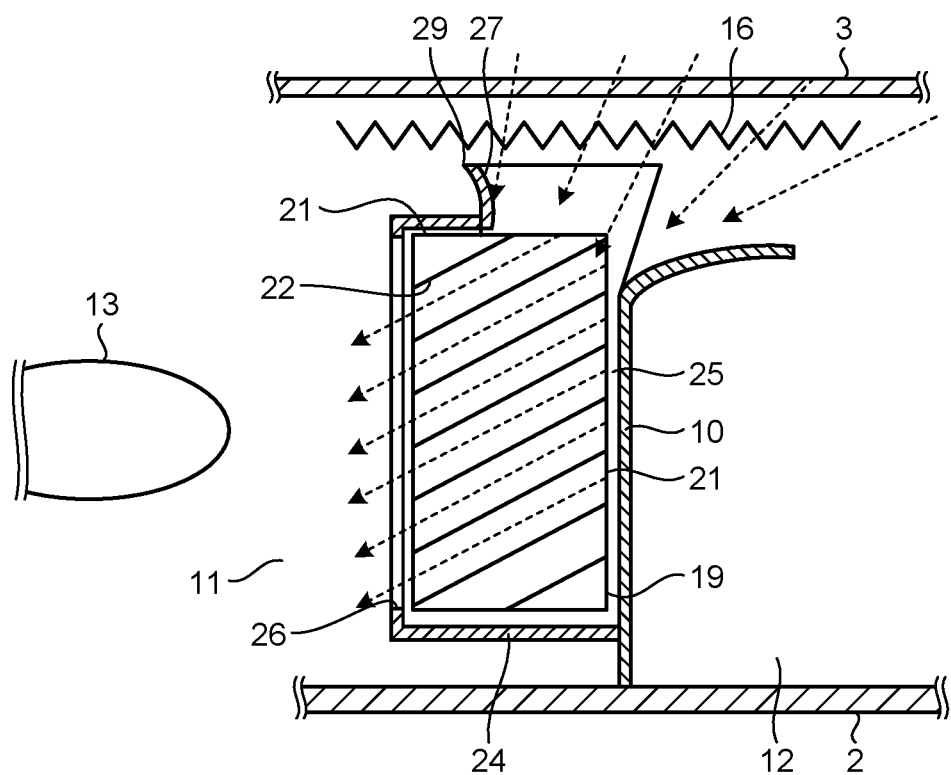
FIG. 7 is an enlarged schematic plan view of a heat dissipator according to a modified example of the first embodiment.

FIG. 7 is an enlarged schematic plan view of the heat dissipator 19 according to a modified example of the first embodiment. As illustrated in FIG. 7, the fins 22 may be formed such that the distance from the front surface 2 to each of the fins 22 decreases from the partition plate 10 side toward the blower 13 side when viewed from above. Even in this case, the fins 22 are smaller in length than in the comparative example when viewed from above. Therefore, heat dissipation efficiency can be improved.

The configurations described in the above embodiment each illustrate an example of the subject matter of the present invention, and it is possible to combine each configuration with another technique that is publicly known, and is also possible to make omissions and changes to part of each configuration without departing from the gist of the present invention.

The invention claimed is:

1. An outdoor unit comprising:
a housing;
a compressor placed in the housing;
a heat exchanger placed in the housing;
a blower placed in the housing, the blower admitting air from outside the housing and passing the air through the heat exchanger;
a partition plate partitioning the housing into a compressor chamber and a blower chamber, the compressor being placed in the compressor chamber, the blower being placed in the blower chamber;
a board on which an electronic component is mounted, the electronic component driving the compressor;
a heat dissipator placed in the blower chamber and adjacent to the partition plate, the heat dissipator including a base and a plurality of fins, the base having a fin formation surface, the fins projecting from the fin formation surface, the heat dissipator dissipating heat of the electronic component; and
a duct covering a tip side of the fins in the heat dissipator to form a flow path, the air passing through the flow path, wherein
when the fins are viewed from the fin formation surface side, the fins extend toward the blower side from the partition plate side, wherein
the duct has a facing surface facing the fin formation surface,
a distance between the facing surface and the fin formation surface is greater in a region on the partition plate side than in a region on the blower side, and
an outlet is formed on the blower side of the duct, the outlet allowing the air to flow out from the flow path.

2. The outdoor unit according to claim 1, wherein a gap is provided between the plurality of fins and the partition plate.

3. The outdoor unit according to claim 2, wherein a height of each of the plurality of fins is greater than a distance between each of the plurality of fins and the partition plate.

4. The outdoor unit according to claim 3, wherein
a first opening admitting the air is formed in a back surface of the housing,
a second opening allowing the air to be discharged is formed in a part of a front surface of the housing, the part corresponding to a wall surface surrounding the blower chamber, and
an inlet allowing the air to flow into the flow path is formed on the back surface side of the duct.

5. The outdoor unit according to claim 4, wherein
the heat dissipator is provided on a first surface of the board,
a plurality of the electronic components is provided, and
the plurality of electronic components is mounted between the board and the heat dissipator, and is arranged side by side from the back surface side to the front surface side.

6. The outdoor unit according to claim 3, wherein
the heat dissipator is provided on a first surface of the board,
a plurality of the electronic components is provided, and
the plurality of electronic components is mounted between the board and the heat dissipator, and is arranged side by side from the back surface side to the front surface side.

7. The outdoor unit according to claim 2, wherein
a first opening admitting the air is formed in a back surface of the housing, a second opening allowing the air to be discharged is formed in a part of a front surface of the housing, the part corresponding to a wall surface surrounding the blower chamber, and an inlet allowing the air to flow into the flow path is formed on the back surface side of the duct.

8. The outdoor unit according to claim 7, wherein the heat dissipator is provided on a first surface of the board, a plurality of the electronic components is provided, and the plurality of electronic components is mounted between the board and the heat dissipator, and is arranged side by side from the back surface side to the front surface side.

9. The outdoor unit according to claim 2, wherein the heat dissipator is provided on a first surface of the board, a plurality of the electronic components is provided, and the plurality of electronic components is mounted between the board and the heat dissipator, and is arranged side by side from the back surface side to the front surface side.

10. The outdoor unit according to claim 1, wherein a height of each of the plurality of fins is greater than a distance between each of the plurality of fins and the partition plate.

11. The outdoor unit according to claim 10, wherein a first opening admitting the air is formed in a back surface of the housing, a second opening allowing the air to be discharged is formed in a part of a front surface of the housing, the part corresponding to a wall surface surrounding the blower chamber, and an inlet allowing the air to flow into the flow path is formed on the back surface side of the duct.

12. The outdoor unit according to claim 11, wherein the heat dissipator is provided on a first surface of the board, a plurality of the electronic components is provided, and the plurality of electronic components is mounted between the board and the heat dissipator, and is arranged side by side from the back surface side to the front surface side.

13. The outdoor unit according to claim 10, wherein the heat dissipator is provided on a first surface of the board, a plurality of the electronic components is provided, and the plurality of electronic components is mounted between the board and the heat dissipator, and is arranged side by side from the back surface side to the front surface side.

14. The outdoor unit according to claim 1, wherein a first opening admitting the air is formed in a back surface of the housing, a second opening allowing the air to be discharged is formed in a part of a front surface of the housing, the part corresponding to a wall surface surrounding the blower chamber, and an inlet allowing the air to flow into the flow path is formed on the back surface side of the duct.

15. The outdoor unit according to claim 14, wherein the heat dissipator is provided on a first surface of the board, a plurality of the electronic components is provided, and the plurality of electronic components is mounted between the board and the heat dissipator, and is arranged side by side from the back surface side to the front surface side.

16. The outdoor unit according to claim 1, wherein the heat dissipator is provided on a first surface of the board, a plurality of the electronic components is provided, and the plurality of electronic components is mounted between the board and the heat dissipator, and is arranged side by side from the back surface side to the front surface side.

\* \* \* \* \*